(12) United States Patent
Kinyua (10) Patent No.: US 9,525,429 B2
(45) Date of Patent: *Dec. 20, 2016

(54) MULTI-STAGE DIGITAL-TO-ANALOG CONVERTER

(71) Applicant: TAIWAN SEMICONDUCTOR MANUFACTURING COMPANY, LTD., Hsinchu (TW)

(72) Inventor: Martin Kinyua, Cedar Park, TX (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/851,263

(22) Filed: Sep. 11, 2015

(65) Prior Publication Data

US 2016/0006451 A1   Jan. 7, 2016

Related U.S. Application Data

(63) Continuation of application No. 14/177,519, filed on Feb. 11, 2014, now Pat. No. 9,136,865.

(51) Int. Cl.
| | |
|---|---|
| H03M 3/00 | (2006.01) |
| H03M 1/74 | (2006.01) |
| H03H 11/04 | (2006.01) |
| H03M 1/66 | (2006.01) |

(52) U.S. Cl.
CPC ............. *H03M 1/74* (2013.01); *H03H 11/04* (2013.01); *H03M 1/661* (2013.01); *H03M 3/414* (2013.01); *H03M 3/50* (2013.01)

(58) Field of Classification Search
CPC .......... H03M 3/454; H03M 3/50; H03M 3/30; H03M 3/368; H03M 3/344; H03M 3/39; H03M 3/502; H03M 7/3004; H03M 7/304; H03M 7/3042; H03M 3/49; H03M 1/508; H03M 1/66; H03M 1/822
USPC ............................................. 341/76, 77, 143
See application file for complete search history.

(56) References Cited

U.S. PATENT DOCUMENTS

| | | | |
|---|---|---|---|
| 5,323,157 A | | 6/1994 | Ledzius et al. |
| 5,369,403 A | * | 11/1994 | Temes ................. H03M 7/3022 341/143 |
| 6,255,977 B1 | | 7/2001 | Jelonnek et al. |

(Continued)

OTHER PUBLICATIONS

Ed van Tuijl,"A 128fs Multi-Bit Sigma-Delta CMOS Audio DAC with Real-Time DEM and 112dB SFDR", 2004, ISSCC.

(Continued)

*Primary Examiner* — Linh Nguyen
(74) *Attorney, Agent, or Firm* — Hauptman Ham, LLP (57) ABSTRACT

A circuit includes a first digital filter that generates a first output based on a digital input and a first digital output signal. A first digital modulator generates the first digital output signal and a first error output based on the first output and a feedback error output. A second digital modulator generates a second output and a second error output based on the first error output. A second digital filter generates a second digital output signal based on the second output, and a third digital filter generates the feedback error output based on the second error output. The second digital output signal and the second error output are based on the first error output amplified by a predetermined gain.

20 Claims, 4 Drawing Sheets

(56) References Cited

U.S. PATENT DOCUMENTS

| | | | |
|---|---|---|---|
| 6,323,794 B1* | 11/2001 | Okuda | H03M 7/3022 341/143 |
| 7,432,841 B1* | 10/2008 | Kinyua | H03M 3/414 341/143 |
| 7,868,798 B2 | 1/2011 | Azadet et al. | |
| 7,969,340 B2 | 6/2011 | Lou et al. | |
| 8,299,946 B2 | 10/2012 | Soenen et al. | |
| 9,136,865 B2* | 9/2015 | Kinyua | H03M 3/414 |
| 2002/0121994 A1 | 9/2002 | Bolton, Jr. | |
| 2002/0196169 A1 | 12/2002 | Okuda et al. | |
| 2004/0036634 A1* | 2/2004 | Level | H03M 7/3033 341/77 |
| 2004/0036640 A1* | 2/2004 | Kawamura | H03M 7/3015 341/143 |
| 2007/0152859 A1* | 7/2007 | Reefman | H03M 3/382 341/144 |
| 2008/0180293 A1* | 7/2008 | Kitahira | H03M 3/358 341/144 |
| 2011/0043398 A1 | 2/2011 | Hezar et al. | |
| 2011/0199246 A1* | 8/2011 | Kinyua | H03M 3/50 341/143 |
| 2012/0242521 A1 | 9/2012 | Kinyua | |
| 2014/0062744 A1* | 3/2014 | Smiley | H03M 1/661 341/144 |

OTHER PUBLICATIONS

K. Nguyen et al. "A 108 dB SNR, 1.1 mW Oversampling Audio DAC With Three-level DEM Technique"; JSSC, vol. 43, No. 12, Dec. 2008.

Office Action dated Feb. 23, 2016 from corresponding No. TW 103145538.

* cited by examiner

MULTI-STAGE DIGITAL-TO-ANALOG CONVERTER

PRIORITY CLAIM

The present application is a continuation of U.S. application Ser. No. 14/177,519, filed Feb. 11, 2014, now U.S. Pat. No. 9,136,865, which is incorporated herein by reference in its entirety.

BACKGROUND

A digital-to-analog converter (DAC) is a device or circuit element that converts digital data into an analog signal. In some applications, the digital data include a predetermined number of different digital codes, and each one of the digital codes corresponds to a unique voltage or current level in the analog signal. For example, in at least one application, N-bit digital data have $2^N$ different digital codes corresponding to $2^N$ different voltage or current levels of a corresponding analog signal, where N is a positive integer. A DAC capable of converting the N-bit digital data to the corresponding analog signal is also referred to as a DAC having an N-bit resolution. In some applications, a DAC having an N-bit resolution is implemented by having at least $2^N$ passive or active electrical components arranged to provide the corresponding $2^N$ different voltage or current levels. The mismatch of the $2^N$ passive or active electrical components causes non-linearity conversion errors to the output analog signal of the DAC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In accordance with one or more embodiment of the present disclosure, a multi-bit, oversampled pulse code modulation (PCM) or pulse density modulation (PDM) signal is converted to a one-bit PWM signal by a first digital modulator and a multi-bit PWM signal by a second digital modulator based on a truncation error of the first digital modulator. In some embodiments, the truncation error of the first digital modulator is effectively eliminated, and the truncation error of the second digital modulator is reduced by a ratio determined by the circuit designer.

Figure 1:
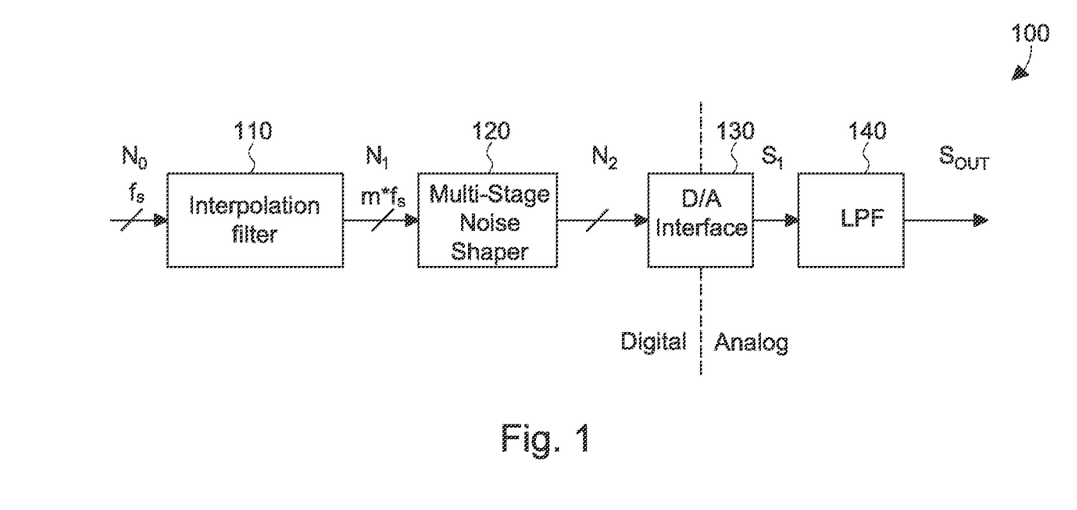
FIG. 1 is a system block diagram of a digital-to-analog converter (DAC) in accordance with some embodiments.

FIG. 1 is a system block diagram of a DAC 100 in accordance with some embodiments. DAC 100 includes a digital section and an analog section. In the digital section, DAC 100 includes an interpolation filter 110 and a noise shaper 120. DAC 100 also includes a D/A interface 130 bridging the digital section and the analog section. In the analog portion, DAC 100 further includes a low pass filter 140.

Interpolation filter 110 receives a digital data $N_0$ and generates an up-sampled digital output $N_1$. Digital data $N_0$ is an N-bit digital signal corresponding to a sampling frequency $f_s$, where N is a positive integer. In some embodiments, digital data $N_0$ is a PCM signal. In some embodiments, digital data $N_0$ is a PDM signal. In some embodiments, N ranges from 16 to 24. In some embodiments, sampling frequency $f_s$ ranges from 48 kHz to 192 kHz. Interpolation filter 110 is configured to generate the up-sampled digital output $N_1$ based on digital data $N_0$ and an up-sampling ratio m. In some embodiments, up-sampled digital output $N_1$ is also an N-bit PCM or PDM digital signal. As a result, up-sampled digital output $N_1$ corresponds to a sampling frequency $m \cdot f_s$. In some embodiments, up-sampling ratio m is greater than 1. In some embodiments, up-sampling ratio m ranges from 10 to 128. In some embodiments, in a frequency domain, interpolation filter 110 functions to spread quantization noises of digital data $N_0$ from a narrower bandwidth corresponding to the sampling frequency of digital data $N_0$ to a greater bandwidth corresponding to the sampling frequency of up-sampled digital output $N_1$.

Noise shaper 120 is a multi-stage noise shaper. Noise shaper 120 receives up-sampled digital output $N_1$ as the digital input of noise shaper 120. Noise shaper 120 generates digital output $N_2$ to be fed to D/A interface 130. In some embodiments, noise shaper 120 has at least a first PWM digital modulator (e.g., 220 in FIG. 2A) and a second PWM digital modulator (e.g., 240 in FIG. 2A). Digital output signal $N_2$ typically has fewer bits (i.e., lower resolution) than up-sampled digital output $N_1$ with a truncation error attributable to the operation of noise shaper 120. In some embodiments, digital output $N_2$ includes at least a first digital output signal and a second digital output signal. The first digital output signal is based on an output of the first digital modulator. The second digital output signal is based on a truncation error of the first digital modulator processed by the second digital modulator. In some embodiments, in a frequency domain, noise shaper 120 suppresses the low frequency noises by pushing most of the noises toward higher frequencies.

D/A interface 130 is configured to generate a reconstructed analog signal $S_1$ based on the digital output $N_2$. Details regarding noise shaper 120 and D/A interface 130 are further illustrated in conjunction with FIG. 2A.

Low pass filter (LPF) 140 generates an analog output signal $S_{OUT}$ by low-pass filtering the reconstructed analog signal $S_1$. In some embodiments, LPF 140 suppresses noises in the reconstructed analog signal $S_1$ that corresponds to a frequency greater than a Nyquist frequency of the digital data $N_0$ (i.e., $0.5 \cdot f_s$).

Figure 2A:
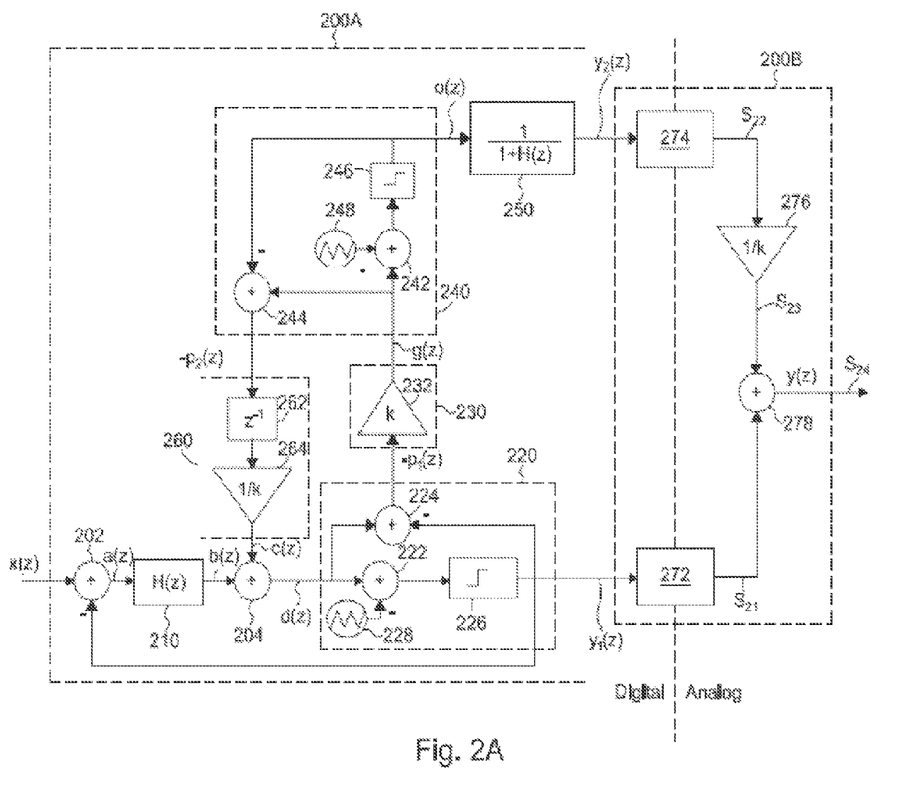
FIG. 2A is a block diagram of a noise shaper and a Pulse Width Modulation (PWM) digital-to-analog (D/A) interface of a DAC in accordance with some embodiments.

FIG. 2A is a block diagram of a noise shaper 200A and a D/A interface 200B of a DAC in accordance with some embodiments. In some embodiments, noise shaper 200A is usable as noise shaper 120 in FIG. 1. In some embodiments, D/A interface 200B is usable as D/A interface 130 in FIG. 1. Various signals in FIG. 2A are illustrated based on their z-domain expression or transfer function.

Noise shaper 200A includes summation units 202 and 204, a first digital filter 210, a first digital modulator 220, a gain block 230, a second digital modulator 240, a second digital filter 250, and a third digital filter 260. Noise shaper 200A receives a digital input represented by a z-domain expression $x(z)$. In some embodiments, the digital input $x(z)$ corresponds to up-sampled digital output $N_1$ in FIG. 1. Noise shaper 200A generates digital output signals represented by z-domain expressions $y_1(z)$ and $y_2(z)$.

Summation unit 202 generates an output represented by $a(z)$, which is determined based on digital input $x(z)$ minus digital output signal $y_1(z)$ in the z-domain. First digital filter 210 has a z-domain transfer function represented by $H(z)$ and configured to generate an output represented by $b(z)$, which is determined based on $H(z)$ and $a(z)$.

Summation unit 204 generates an output represented by $d(z)$, which is a summation of $a(z)$ from first digital filter 210 and a feedback error output $c(z)$ from third digital filter 260 in the z-domain. First digital modulator 220 generates the first digital output signal $y_1(z)$ and a first error output $-p_1(z)$ based on $d(z)$.

First digital modulator 220 includes summation unit 222 and 224 and a truncator 226. Summation unit 222 receives $d(z)$ and a digital pulse width modulation carrier 228, and truncator 226 generates the first digital output signal $y_1(z)$ based on the output of summation unit 222. In some embodiments, truncator 226 is a single-bit truncator, and summation unit 222 and truncator 226 are configured as a PWM digital modulator. Summation unit 224 receives $d(z)$ and first digital output signal $y_1(z)$ and generates the first error output $-p_1(z)$.

Gain block 230 includes an amplification unit 232 that receives and amplifies first error output $-p_1(z)$ by a predetermined ratio (and sometimes also being referred to as "gain") k, thereby generating a second error output represented by $g(z)=-k \cdot p_1 z$.

Second digital modulator 240 includes summation unit 242 and 244 and a truncator 246. Summation unit 242 receives $g(z)$ and a digital pulse width modulation carrier 248, and truncator 246 generates an output represented by $o(z)$ based on the output of summation unit 242. In some embodiments, truncator 246 is a single-bit truncator, and summation unit 242 and truncator 246 are configured as a PWM digital modulator. Summation unit 244 receives $g(z)$ and output $o(z)$ and generates a third error output $-p_2(z)$.

Second digital filter 250 has a z-domain transfer function represented by $$\frac{1}{1 + H(z)}$$

and configured to generate the second digital output signal $y_2(z)$ based on $$\frac{1}{1 + H(z)}$$

and $o(z)$. In some embodiments, output $o(z)$ is a single-bit PWM signal, and second digital output signal $y_2(z)$ is a multi-bit PWM signal.

Third digital filter 260 includes a delay unit 262 and an amplification unit 264 configured to have a transfer function $$\frac{z^{-1}}{k}.$$

Third digital filter 260 thus generates feedback error output represented by $$c(z) = -\frac{z^{-1}}{k} \cdot p_2(z).$$

Based on the foregoing, noise shaper 200A is configured to generate first digital output $y_1(z)$ and second digital output $y_2(z)$ that $$y_1(z) = x(z)\frac{H(z)}{1 + H(z)} + \left(p_1(z) - \frac{p_2(z) \cdot z^{-1}}{k}\right)\left(\frac{1}{1 + H(z)}\right), \text{ and}$$

$$y_2(z) = k\left(\frac{p_2(z)}{k} - p_1(z)\right)\left(\frac{1}{1 + H(z)}\right).$$

In some embodiments, $H(z)$ is a one or multiple order low-pass digital filter. In some embodiments, $H(z)$ is $$\frac{z^{-1}}{1 - z^{-1}}.$$

In some embodiments, k is a positive integer ranges from 2 to 16. In some embodiments, k is a multiple of 2.

In some embodiments, noise shaper 200A is implemented by a hard-wired logic circuit. In some embodiments, first digital filter 210, second digital filter 250, first digital modulator 220, and the second digital modulator 240 are operated based on a clock frequency equal to the second sampling frequency $m \cdot f_s$. In some embodiments, noise shaper 200A is implemented by a digital signal processing unit executing a set of instructions.

D/A interface 200B includes a first DAC unit 272, a second DAC unit 274, an amplifier 276, and a reconstruction unit.

First DAC unit 272 is configured to generate a first analog output signal $S_{21}$ based on the first digital output signal $y_1(z)$. In some embodiments, first DAC unit 272 is a single-bit PWM DAC. In some embodiments, DAC unit 272 is a switched-capacitor type DAC. In some embodiments, DAC 272 is a current-steering type DAC.

Second DAC unit 274 is configured to generate a second analog output signal $S_{22}$ based on the second digital output signal $y_2(z)$. In some embodiments, second DAC unit is a multi-bit DAC. In some embodiments, DAC unit 274 is a switched-capacitor type DAC. In some embodiments, DAC unit 274 is a current-steering type DAC.

Amplifier 276 is configured to generated a scaled second analog output signal $S_{23}$ based on the second analog output signal $S_{22}$ and a scaling ratio $$\frac{1}{k}.$$

Reconstruction unit 278 is configured to generated a reconstructed analog signal $S_{24}$ based on adding the first analog output signal $S_{21}$ and the scaled second analog output signal $S_{23}$. In some embodiments, reconstructed analog signal $S_{24}$ is usable as the reconstructed analog signal $S_1$ in FIG. 1.

Based on the foregoing, reconstructed analog signal $S_{24}$ has a z-domain expression y(z) that $$y(z) = y_1(z) + \frac{1}{k} y_2(z), \text{ and}$$

$$y(z) = x(z) \frac{H(z)}{1+H(z)} + \frac{p_2(z)}{k}\left(\frac{1-z^{-1}}{1+H(z)}\right).$$

As a result, reconstructed analog signal $S_{24}$ as represented by y(z) has an approximately unit gain at lower frequencies. Also, error $p_1(z)$ is eliminated, and error $p_2(z)$ is reduced by the predetermined ratio k.

Figure 2B:
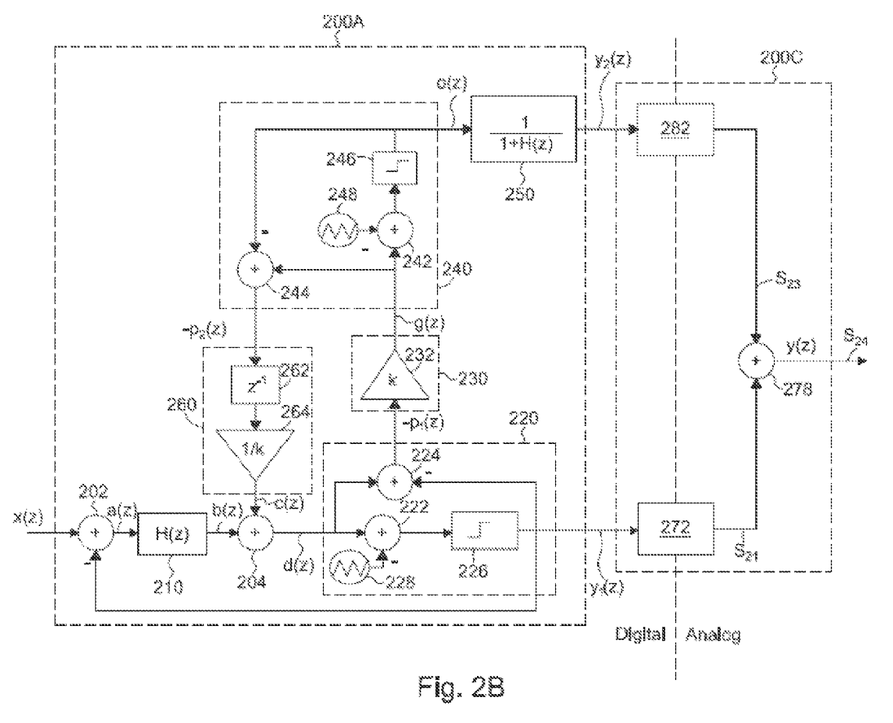
FIG. 2B is a block diagram of a noise shaper and a PWM digital-to-analog (D/A) interface of another DAC in accordance with some embodiments.

FIG. 2B is a block diagram of a noise shaper 200A and a D/A interface 200C of another DAC in accordance with some embodiments. Components in FIG. 2B that are the same or similar to those in FIG. 2A are given the same reference numbers, and detailed description thereof is omitted.

Compared with D/A interface 200B in FIG. 2A, D/A interface 200C has a DAC unit 282 that is configured to generate a scaled second analog output signal $S_{23}$ based on the second digital output signal $y_2(z)$ and the scaling ratio $$\frac{1}{k}.$$

In other words, the function of amplifier 276 in FIG. 1 is integrally implemented within DAC unit 282. In some embodiments, the scaling of signal is performed by configuring the size or ratio of capacitors when DAC unit 282 is a switched-capacitor type DAC; or by configuring the size or ratio of current elements when DAC unit 282 is a current-steering type DAC.

Figure 3:
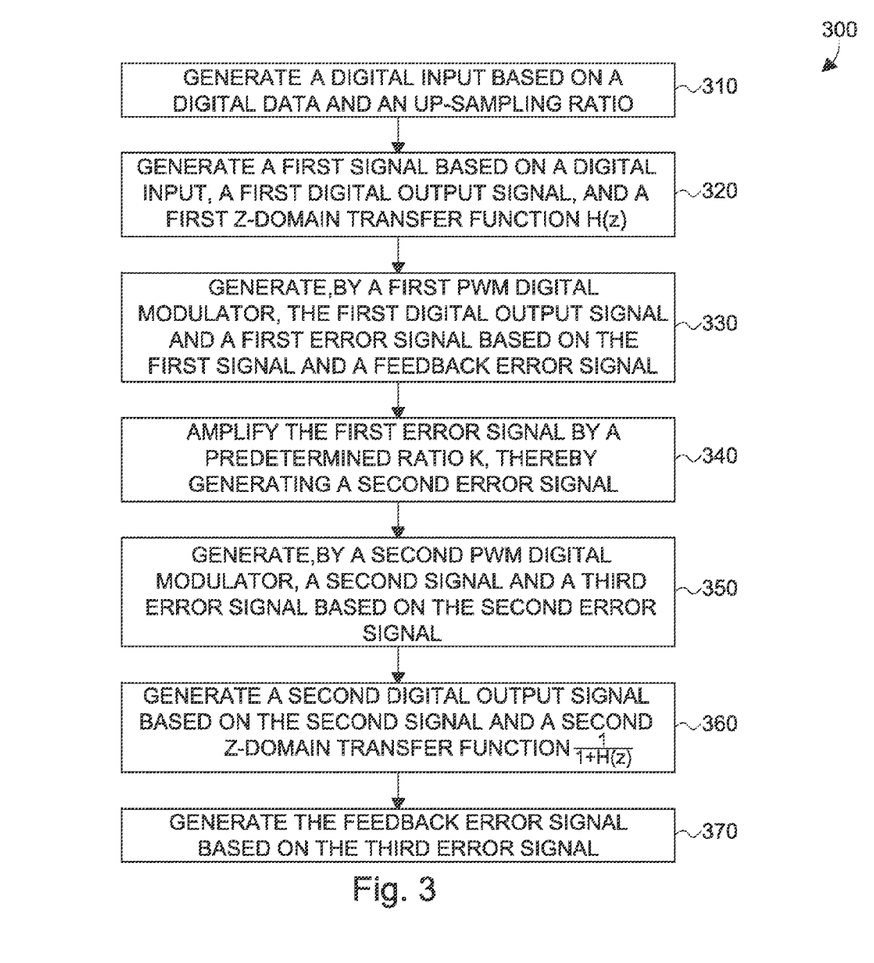
FIG. 3 is a flow chart of a method of operating a PWM DAC in accordance with some embodiments.

FIG. 3 is a flow chart of a method 300 of operating a DAC, such as a DAC illustrated in conjunction with FIGS. 1, 2A, and 2B, in accordance with some embodiments. It is understood that additional operations may be performed before, during, and/or after the method 300 depicted in FIG. 3, and that some other processes may only be briefly described herein.

As depicted in FIG. 1 and FIG. 3, the process 300 starts with operation 310, where a digital input $N_1$ is generated based on a digital data $N_0$ and an up-sampling ratio m. The digital data $N_0$ corresponds to a first sampling frequency $f_s$, the digital input $N_1$ corresponds to a second sampling frequency $m \cdot f_s$, and m is greater than 1. In some embodiments, $f_s$ ranges from 48 kHz to 192 kHz. In some embodiments, up-sampling ratio m ranges from 10 to 128. In some embodiments, digital input $N_1$ is an N-bit PDM signal or PCM signal. In some embodiments, N ranges from 16 to 24.

As depicted in FIG. 2A and FIG. 3, the process 300 proceeds to operation 320, where a signal having a z-domain expression b(z) is generated based on digital input $N_1$ represented by a z-domain expression x(z), a first digital output signal $y_1(z)$, and a first z-domain transfer function H(z). In some embodiments, the z-domain transfer function H(z) is $$\frac{z^{-1}}{1-z^{-1}}.$$

The process 300 proceeds to operation 330, where the first digital output signal $y_1(z)$ and a first error signal $-p_1(z)$ are generated by digital modulator 220 based on the signal b(z) and a feedback error signal c(z). In some embodiments, first digital output signal $y_1(z)$ is a single-bit PWM signal.

The process proceeds to operation 340, where the first error signal $-p_1(z)$ is amplified by a predetermined ratio k, thereby generating a second error signal g(z). In some embodiments, ratio k ranges from 2 to 16. In some embodiments, ratio k is a multiple of 2.

The process proceeds to operation 350, where a second signal o(z) and a third error signal $-p_2(z)$ are generated by digital modulator 240 based on the second error signal g(z). In some embodiments, second signal o(z) is a single-bit PWM signal.

The process proceeds to operation 360, where a second digital output signal $y_2(z)$ is generated based on the second signal o(z) and a second z-domain transfer function $$\frac{1}{1+H(z)}.$$

In some embodiments, second digital output signal $y_2(z)$ is a multi-bit PWM signal.

The process proceeds to operation 370, where the feedback error signal c(z) is generated based on third error signal $-p_2(z)$ and a z-domain transfer function $$\frac{z^{-1}}{k}.$$

In some embodiments, a circuit comprises a first digital filter configured to generate a first output based on a digital input and a first digital output signal, a first digital modulator configured to generate the first digital output signal and a first error output based on the first output and a feedback error output, and a second digital modulator configured to generate a second output and a second error output based on the first error output. The circuit further comprises a second digital filter configured to generate a second digital output signal based on the second output and a third digital filter configured to generate the feedback error output based on the second error output. The second digital output signal and the second error output are based on the first error output amplified by a predetermined gain.

In some embodiments, a circuit comprises a first digital modulator configured to generate a first digital output signal and a first error output based on a filtered digital input, a first digital-to-analog converter circuit configured to generate a first analog output signal based on the first digital output signal, and a gain block configured to amplify the first error output by a predetermined ratio, thereby generating a second error output. The circuit further comprises a second digital modulator configured to generate a second output based on the second error output, a digital filter configured to generate a second digital output signal based on the second output, a second digital-to-analog converter circuit configured to generate a scaled second analog output signal based on the second digital output signal and a scaling ratio inversely proportional to the predetermined ratio, and a reconstruction unit configured to generate a reconstructed analog signal based on the first analog output signal and the scaled second analog output signal.

In some embodiments, a method comprises receiving, by a first digital modulator, a filtered digital input, generating, by the first digital modulator, a first digital output signal and a first error output based on the filtered digital input, generating, by a first digital-to-analog converter circuit, a first analog output signal based on the first digital output signal, and amplifying, by a gain block, the first error output by a predetermined ratio to generate a second error output. The method further comprises generating, by a second digital modulator, a second output based on the second error output, generating, by a digital filter, a second digital output signal based on the second output, generating, by a second digital-to-analog converter circuit, a scaled second analog output signal based on the second digital output signal and a scaling ratio inversely proportional to the predetermined ratio, and generating, by a reconstruction unit, a reconstructed analog signal based on the first analog output signal and the scaled second analog output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a first digital filter configured to generate a first output based on a digital input and a first digital output signal;
    a first digital modulator configured to generate the first digital output signal and a first error output based on the first output and a feedback error output;
    a second digital modulator configured to generate a second output and a second error output based on the first error output;
    a second digital filter configured to generate a second digital output signal based on the second output; and
    a third digital filter configured to generate the feedback error output based on the second error output,
    wherein the second digital output signal and the second error output are based on the first error output amplified by a predetermined gain.

2. The circuit of claim 1, wherein the third digital filter has a transfer function inversely related to the predetermined gain.

3. The circuit of claim 1, further comprising:
    a digital-to-analog interface configured to generate a reconstructed analog signal based on a first analog signal component corresponding to the first digital output signal and a second analog signal component corresponding to the second digital output signal,
    wherein the digital-to-analog interface is configured to generate the second analog signal component attenuated by a scaling ratio inversely related to the predetermined gain.

4. The circuit of claim 3, wherein the digital-to-analog interface comprises:
    a first digital-to-analog converter configured to generate the first analog signal component;
    a second digital-to-analog converter configured to generate the second analog signal component; and
    an amplifier configured to attenuate the second analog signal component.

5. The circuit of claim 3, wherein the digital-to-analog interface comprises:
    a first digital-to-analog converter configured to generate the first analog signal component;
    a second digital-to-analog converter configured to generate and attenuate the second analog signal component.

6. The circuit of claim 3, further comprising a low pass filter, wherein
    the digital input is based on a digital data, and
    the low pass filter is configured to suppress noise in the reconstructed analog signal corresponding to a frequency greater than a Nyquist frequency of the digital data.

7. The circuit of claim 1, wherein the first digital modulator comprises:
    a summation unit configured to receive the first digital output signal and a summation of the first output and the feedback error output, and to generate the first error output.

8. The circuit of claim 1, wherein the first digital modulator is further configured to generate the first digital output signal and the first error output as single-bit pulse width modulation signals.

9. The circuit of claim 1, wherein the second digital modulator comprises:
    a summation unit configured to receive the amplified first error output signal and the second output, and to generate the second error output.

10. The circuit of claim 1, wherein the second digital modulator is further configured to generate the second output and the second error output as single-bit pulse width modulation signals.

11. The circuit of claim 1, wherein second digital filter is further configured to generate the second digital output signal as a multi-bit pulse width modulation signal.

12. The circuit of claim 1, further comprising:
    an interpolation filter configured to generate the digital input based on a digital data corresponding to a first sampling frequency,
    wherein
    the digital input corresponds to a second sampling frequency, and
    the first digital filter, the second digital filter, the first digital modulator, and the second digital modulator are operable based on a clock frequency equal to the second sampling frequency.

13. A circuit, comprising:
a first digital modulator configured to generate a first digital output signal and a first error output based on a filtered digital input;
a first digital-to-analog converter circuit configured to generate a first analog output signal based on the first digital output signal;
a gain block configured to amplify the first error output by a predetermined ratio, thereby generating a second error output;
a second digital modulator configured to generate a second digital output and a third error output based on the second error output;
the first digital modulator being further configured to generate the first digital output signal and the first error output based also on the third error output;
a digital filter configured to generate a third digital output signal based on the second digital output;
a second digital-to-analog converter circuit configured to generate a scaled second analog output signal based on the second digital output and a scaling ratio inversely proportional to the predetermined ratio; and
a reconstruction unit configured to generate a reconstructed analog signal based on the first analog output signal and the scaled second analog output signal.

14. The circuit of claim 13, wherein the second digital-to-analog converter circuit comprises a digital-to-analog converter and an amplifier having the scaling ratio.

15. The circuit of claim 13, further comprising:
an interpolation filter configured to generate an unfiltered digital input corresponding to the filtered digital input, the unfiltered digital input being based on a digital data corresponding to a first sampling frequency,
wherein
the unfiltered digital input corresponds to a second sampling frequency, and
the first digital filter, the second digital filter, the first digital modulator, and the second digital modulator are operable based on a clock frequency equal to the second sampling frequency.

16. The circuit of claim 15, further comprising a low pass filter configured to suppress noise in the reconstructed analog signal corresponding to a frequency greater than a Nyquist frequency of the digital data.

17. The circuit of claim 13, wherein the first digital-to-analog converter circuit is a single-bit digital-to-analog converter and the second digital-to-analog converter circuit is a multi-bit digital-to-analog converter.

18. A method, comprising:
receiving, by a first digital modulator, a filtered digital input;
generating, by the first digital modulator, a first digital output signal and a first error output based on the filtered digital input;
generating, by a first digital-to-analog converter circuit, a first analog output signal based on the first digital output signal;
amplifying, by a gain block, the first error output by a predetermined ratio to generate a second error output;
generating, by a second digital modulator, a second digital output and a third error output based on the second error output;
the generating a first digital output signal and a first error output being based also on the third error output;
generating, by a digital filter, a third digital output signal based on the second digital output;
generating, by a second digital-to-analog converter circuit, a scaled second analog output signal based on the second digital output and a scaling ratio inversely proportional to the predetermined ratio; and
generating, by a reconstruction unit, a reconstructed analog signal based on the first analog output signal and the scaled second analog output signal.

19. The method of claim 18, further comprising:
up-sampling a digital data corresponding to a first sampling frequency to generate an unfiltered digital input corresponding to the filtered digital input, the unfiltered digital input corresponding to a second sampling frequency; and
operating the digital filter, the first digital modulator, and the second digital modulator with a clock frequency equal to the second sampling frequency.

20. The method of claim 19, further comprising:
filtering the reconstructed analog signal to suppress noise corresponding to a frequency greater than a Nyquist frequency of the digital data.

* * * * *